(12) United States Patent
Umemoto

(10) Patent No.: US 7,982,128 B2
(45) Date of Patent: Jul. 19, 2011

(54) METHOD FOR REGENERATING PHOTOVOLTAIC MODULE AND PHOTOVOLTAIC MODULE

(75) Inventor: Akimasa Umemoto, Sakurai (JP)

(73) Assignee: Sharp Kabushiki Kaisha, Osaka (JP)

( * ) Notice: Subject to any disclaimer, the term of this patent is extended or adjusted under 35 U.S.C. 154(b) by 423 days.

(21) Appl. No.: 12/174,112

(22) Filed: Jul. 16, 2008

(65) Prior Publication Data

US 2008/0276988 A1 Nov. 13, 2008

Related U.S. Application Data

(63) Continuation of application No. 10/454,834, filed on Jun. 5, 2003, now Pat. No. 7,442,872.

(30) Foreign Application Priority Data

Jun. 6, 2002 (JP) .................................. 2002-165831

(51) Int. Cl.
*H01L 31/042* (2006.01)
(52) U.S. Cl. ........................................................ 136/251
(58) Field of Classification Search .................... 136/251
See application file for complete search history.

(56) References Cited

U.S. PATENT DOCUMENTS

| 5,476,553 | A | * | 12/1995 | Hanoka et al. | 136/251 |
| 5,728,230 | A | | 3/1998 | Komori et al. | |
| 5,733,382 | A | * | 3/1998 | Hanoka | 136/251 |
| 5,741,370 | A | * | 4/1998 | Hanoka | 136/251 |
| 6,294,724 | B1 | | 9/2001 | Sasaoka et al. | |
| 6,407,329 | B1 | * | 6/2002 | Iino et al. | 136/251 |
| 6,940,008 | B2 | | 9/2005 | Shiotsuka et al. | |
| 2002/0129848 | A1 | | 9/2002 | Miura et al. | |
| 2004/0003840 | A1 | | 1/2004 | Umemoto | |

FOREIGN PATENT DOCUMENTS

| DE | 19539699 A1 | 4/1997 |
| JP | 08-037317 | 2/1996 |
| JP | 11-062143 | 3/1999 |
| JP | 11-289103 | 10/1999 |
| JP | 2000-269535 | 9/2000 |
| JP | 2001-217446 | 8/2001 |

OTHER PUBLICATIONS

Patent Abstracts of Japan, Yamada Satoshi et al, 11-307799, Nov. 5, 1999, "Method for Repairing Solar Cell Module".

(Continued)

*Primary Examiner* — Jeffrey T Barton
(74) *Attorney, Agent, or Firm* — Nixon & Vanderhye P.C.

(57) ABSTRACT

The present invention allows a crystalline photovoltaic module having a super straight type structure in which a light-receiving surface side-sealing EVA layer 2, a photovoltaic cell matrix 3, a back surface side-sealing EVA layer 4 and a back surface-sealing weatherproof film 5 are laminated sequentially in this order on a light-receiving glass 1 and these components are formed into an integral piece to be reused after it has been used in the market for a long time by extending the lifetime of the photovoltaic module. The regeneration method includes peeling the back surface-sealing weatherproof film 5, laminating a new back surface side-sealing EVA layer 8 and a new back surface-sealing weatherproof film 9 in a portion in which the film has been peeled, and then curing for crosslinking the new back surface side-sealing EVA layer 8 that is laminated.

2 Claims, 3 Drawing Sheets

OTHER PUBLICATIONS

German Publication No. DE19738302, Werner et al, "Method for optimizing solar module output", Mar. 4, 1999 (with English abstract).

German Publication No. DE19814978, Joerg et al, "Measuring current-induced temperature changes in an object enables qualitative and quantitative investigation of electrical properties of object under operating condition by acquiring high-resolution thermographic object images", Oct. 14, 1999 (with English abstract).

Gross et al, "Thermosensoric Localization of Defects in CIS Solar Modules", $26^{th}$ PVSC, Sep. 30-Oct. 3, 1997, Anaheim, CA.

* cited by examiner

METHOD FOR REGENERATING PHOTOVOLTAIC MODULE AND PHOTOVOLTAIC MODULE

This application is a continuation of application Ser. No. 10/454,834, filed Jun. 5, 2003 (now U.S. Pat. No. 7,442,872), which claims benefit of Japanese Application No. 2002-165831, filed Jun. 6, 2002, the entire contents of each of which is hereby incorporated by reference in this application.

BACKGROUND OF THE INVENTION

1. Field of the Invention

The present invention relates to a method for regenerating a photovoltaic module and a photovoltaic module. More specifically, the present invention relates to a method for regenerating a crystalline photovoltaic module having a super straight type structure in which a light-receiving surface side-sealing resin (EVA: ethylene vinyl acetate) layer, a photovoltaic cell, a back surface side-sealing resin (EVA) layer and a back surface side-sealing weatherproof film are laminated sequentially in this order on a light-receiving glass and these components are formed into an integral piece, and such a photovoltaic module.

2. Description of the Related Art

Photovoltaic modules have been developed and produced with weatherproofness, durability and reliability for long term operation as the first priority so that the photovoltaic modules can be used in exposed outdoor locations over a long time. For example, reliability tests of crystalline photovoltaic modules are defined in JIS C8917 or IEC61215, and manufacturers of photovoltaic modules have made efforts to satisfy the requirements of the tests and further have pursued for higher reliability with their own safety margins.

Photovoltaic modules for houses have been rapidly spread, partly because of the governmental aid for private houses that started in 1996 in Japan together with increased consciousness of environmental problems. This rapid spread has resulted from the efforts put to a market development by suppliers, which have make it possible to install a photovoltaic module with about 3 KW, which covers all power consumption of a standard household, on a roof of a house, and to develop a photovoltaic module whose appearance goes with the roof of a house and a method for installing the photovoltaic module.

On the other hand, industrial photovoltaic modules that are installed in buildings, warehouses, gymnastic halls, or large capacity public buildings have been remarkably spread. Power generating systems for the industrial field for buildings are attributed mostly to the demand creation of the NEDO field test projects that started in 1992 in Japan, and in recent years, industrial power generating systems developed by the private sector also have been started to be introduced. Their features are that unlike a power generation of about 3 KW for general households, the power generation scale is as large as 10 KW or more, and the area for installation is large.

In order to achieve the new energy introduction outline, the solar power generating system has been promoted energetically by both public and private sectors, as described above. However, the system has a lifetime as long as it is man-made equipment, so that eventually it is disposed of or recycled.

The solar power generating system is in the early stage of the introduction, and its life is long, so that there is little need of treatment after use. It is very important and necessary also in view of the nature as a commercial product to develop the technologies for disposal methods or the recycling properties of the photovoltaic modules in order to prepare for the future introduction in large quantity. However, it is difficult to disintegrate the photovoltaic module, and it is also true that if a material and a structure that allow the photovoltaic module to be disintegrated easily are used, long term reliability cannot be ensured. There is no clear definition as to a specific quantitative lifetime of the photovoltaic module.

In other words, unlike other electrical products, the photovoltaic module has a peculiarity in that it should continue to generate power, once it is installed. In recent years, the guarantee period of manufactures of the photovoltaic module is generally 10 years, but even if this period has passed, the photovoltaic module does not stop working. On the other hand, although it is desirable to select and collect the materials when the photovoltaic module has stopped generating electricity, the current state of the art cannot balance the cost and benefits, and therefore there is no other way but to dispose of the photovoltaic module as special industrial waste.

Thus, it is useful in terms of recycling and reuse to allow the photovoltaic module to generate power as long as possible, that is, to extend the lifetime of the photovoltaic module.

SUMMARY OF THE INVENTION

The present invention has been achieved in view of the above-described current circumferences, and it is an object of the present invention to provide a method for regenerating a photovoltaic module that can extend the lifetime of a photovoltaic module that has been used in the market for a long time and the photovoltaic module that has been treated by such a generating method.

The present invention is directed to extension of the lifetime of photovoltaic modules by focusing on the fact that in a photovoltaic module used in the market for a long time, the weakest point is deterioration of the back surface side-sealing resin (EVA), and by arranging a new sealing resin (EVA) on a part of or the entire back surface of the back surface side-sealing resin (existing sealing resin) so as to regenerate the performance of the back surface side-sealing resin. Specific structures will be described below.

A method for regenerating a photovoltaic module of the present invention is a method for regenerating a photovoltaic module (crystalline photovoltaic module having a super straight type structure) in which a light-receiving surface side-sealing resin layer, a photovoltaic cell, a back surface side-sealing resin layer and a back surface-sealing weatherproof film are laminated sequentially in this order on a light-receiving glass (on the back surface side) and these components are formed into an integral piece. The method is characterized by peeling the back surface-sealing weatherproof film; laminating a new sealing resin (EVA) and a new back surface-sealing weatherproof film in a portion in which the film has been peeled; and then curing for crosslinking the new sealing resin that is laminated.

By performing a regeneration treatment in this manner, the lifetime of the photovoltaic module can be extended, and the photovoltaic module can be reused (recycled).

In the method for regenerating a photovoltaic module of the present invention, the temperature distribution (in-plane distribution) in the back surface of the module when current is flowing through the photovoltaic module or the temperature distribution (in-plane distribution) in the back surface of the module when solar light is applied to the light-receiving surface while the positive electrode and the negative electrode of the photovoltaic module are short-circuited may be detected by a thermal image detecting apparatus (e.g., an infrared thermoviewer), a portion to be treated for regeneration may be specified based on the results of the detection of the temperature distribution, and a regeneration treatment may be performed partially.

According to the present invention, when repairing partially the photovoltaic module that has been used in the market for a long time for regeneration and reuse, cell breakage or microcracks of the cell that are not visually observed can be detected. When there is a space between the EVA on the back surface of the cell and the back surface-sealing weatherproof film due to penetration of water vapor, outgas or the like, deterioration caused by the space can be detected. Thus, a portion to be treated for regeneration can be specified precisely.

In the method for regenerating a photovoltaic module of the present invention, the back surface-sealing weatherproof film can be peeled easily by peeling the back surface-sealing weatherproof film after the photovoltaic module is exposed outdoors.

For example, provided that the back surface-sealing weatherproof film is formed of a material containing ester bonds. When peeling the back surface-sealing weatherproof film from the photovoltaic module, the photovoltaic module is placed in an environment of a temperature or humidity cycle or a combined cycle by outdoor exposure. As a result, the ester bonds are broken by hydrolysis, and film deterioration and breakage is caused by a reduction of the molecular weight. Therefore, peeling can be performed easily even in a mechanical method (e.g., manual peeling). Further, even if the back surface-sealing weatherproof film does not contain ester bonds, a reduction of the molecular weight or crystallization of polymers of the film promote the film fatigue. Therefore, even mechanical peeling can be performed easily.

In the method for regenerating a photovoltaic module of the present invention, the back surface-sealing weatherproof film can be peeled even more easily than in the above manner, by peeling the back surface-sealing weatherproof film after the photovoltaic module is exposed to high temperature water vapor.

The reason for this is as follows. For example, provided that the back surface-sealing weatherproof film is formed of a material containing ester bonds. When peeling the back surface-sealing weatherproof film from the photovoltaic module, the photovoltaic module is placed under high temperature water vapor. As a result, the promoting function of a hydrolysis reaction by the high temperature water vapor causes film deterioration and breakage to occur even more rapidly by the breaking of the ester bonds or a reduction of the molecular weight. Further, even if the back surface-sealing weatherproof film does not contain ester bonds, a reduction of the molecular weight or crystallization of polymers of the film proceed rapidly and thus the film fatigue proceeds even more rapidly.

In the photovoltaic module of the present invention, it is preferable that the new sealing resin (EVA) to be used for the regeneration treatment has a shorter crosslinking time than that of the existing sealing resin (EVA) that originally has sealed the photovoltaic cell. In this manner, by making the crosslinking time of the new sealing resin short, the existing sealing resin (EVA) can be prevented from being crosslinked excessively when attaching and curing for crosslinking the new back surface-sealing weatherproof film with the new sealing resin, so that poor appearance due to shrinkage of the EVA or generation of outgas and removal of serial wiring of the photovoltaic cell, etc. can be prevented.

In the photovoltaic module of the present invention, it is preferable that the new sealing resin (EVA) to be used for the regeneration treatment has a lower crosslinking temperature than that of the existing sealing resin (EVA) that originally has sealed the photovoltaic cell. In this manner, by making the crosslinking temperature of the new sealing resin low, the existing sealing resin (EVA) can be prevented from being crosslinked excessively when attaching and curing for crosslinking the new back surface-sealing weatherproof film with the new sealing resin, so that poor appearance due to shrinkage of the EVA or generation of outgas and removal of serial wiring of the photovoltaic cell, etc. can be prevented.

In the photovoltaic module of the present invention, it is preferable that the new sealing resin (EVA) to be used for the regeneration treatment contains a larger amount of an anti-ultraviolet agent (ultraviolet stabilizer) than that of the existing sealing resin (EVA) that originally has sealed the photovoltaic cell. By containing a large amount of an anti-ultraviolet agent in the new sealing resin, the anti-ultraviolet agent can be diffused by integrating the new sealing resin and the existing sealing resin. Therefore, in the photovoltaic module that has been used in the market for a long time, even if the anti-ultraviolet agent of the existing sealing resin that originally has sealed the photovoltaic module has been consumed and disappeared, the anti-ultraviolet agent can be replenished from the new back surface side-sealing resin layer (EVA) to the existing back surface side-sealing resin layer (EVA), which two layers constitute a two-layered structure by the regeneration treatment.

In the photovoltaic module of the present invention, it is preferable that when regenerating the module by removing and attaching entirely the back surface-sealing weatherproof film, the new back surface-sealing weatherproof film to be used for regeneration is black at least on the light-receiving surface side. In this manner, by using the black new sealing weatherproof film at least on the light-receiving surface side, possibly occurrence of poor appearance such as a color change into yellow of the existing sealing resin (EVA) that originally has sealed the photovoltaic module cannot become distinct in the entire appearance.

In the method for regenerating a photovoltaic module of the present invention, work for the regeneration treatment such as the film peeling, lamination and integration of the sealing resin and the film and the like can be performed efficiently, by performing the regeneration treatment in such a manner that before peeling the back surface-sealing weatherproof film, a frame of the photovoltaic module and/or a terminal box are removed, and then the regeneration treatment with the new sealing resin and the new back surface-sealing weatherproof film is performed, and thereafter a new terminal box and/or a new frame of the photovoltaic module or the existing terminal box and/or the existing frame of the photovoltaic module that were removed are attached.

Herein, the photovoltaic module that is regenerated by the method having the above-described characteristics has a two-layered structure in a part or the entire of the back surface side-sealing resin layer, and therefore in a crystalline photovoltaic module having a super straight type structure, when a part or the entire of the back surface side-sealing resin layer has a two-layered structure, that photovoltaic module can be specified to be a regenerated product.

Therefore, in the photovoltaic module of the present invention, a light-receiving surface side-sealing resin layer, a photovoltaic cell, a back surface side-sealing resin layer and a back surface-sealing weatherproof film are laminated sequentially in this order on a light-receiving glass (on the back surface side) and these components are formed into an integral piece, and the feature that a part or the entire of the back surface side-sealing resin layer has a two-layered structure specifies the present invention.

DESCRIPTION OF THE PREFERRED EMBODIMENTS

Hereinafter, embodiments of the present invention will be described with reference to the accompanying drawings. The present invention is not limited only to the following embodiments.

Figure 1:
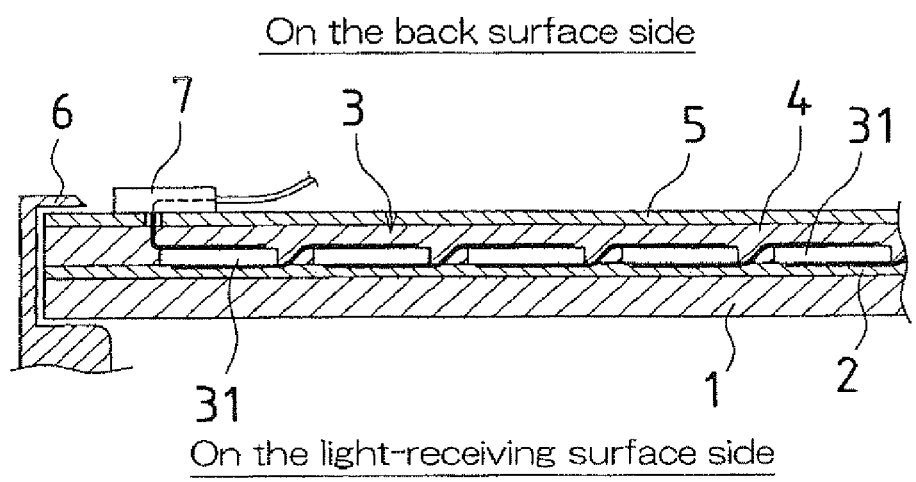
FIG. 1 is a schematic cross-sectional view showing the structure of a photovoltaic module to which the present invention is applied.

FIG. 1 is a schematic cross-sectional view showing the structure of a photovoltaic module to which the present invention is applied.

Figure 2:
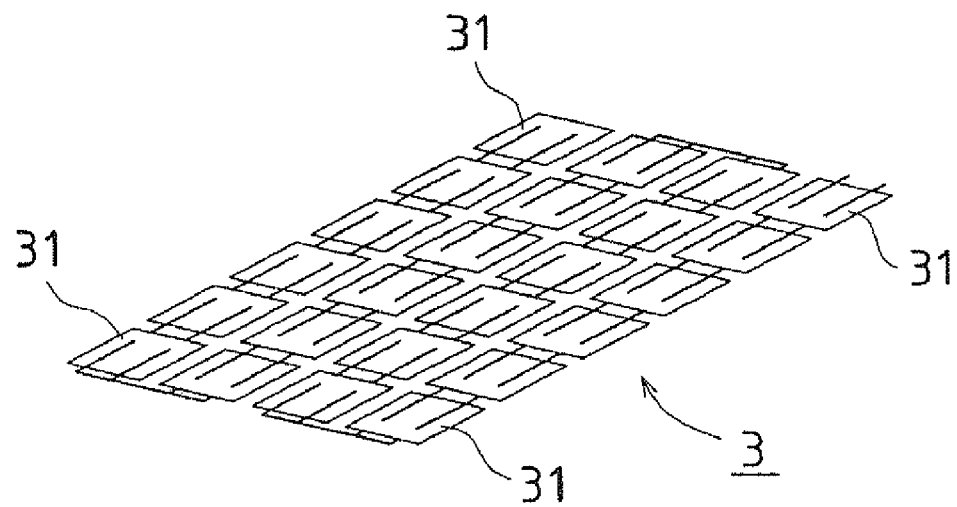
FIG. 2 is a schematic perspective view showing the structure of a photovoltaic cell matrix.

The photovoltaic module of FIG. 1 is a crystalline photovoltaic module having a super straight structure, and includes a light-receiving glass 1, a light-receiving surface side-sealing EVA layer 2, a photovoltaic cell matrix 3, a back surface side-sealing EVA layer 4, and a back surface-sealing weatherproof film 5. The photovoltaic cell matrix 3 is an arrangement of a plurality of photovoltaic cells 31, . . . 31 in a matrix as shown in FIG. 2, and these photovoltaic cells 31, . . . 31 are connected in series with wires.

In the photovoltaic module of FIG. 1, a white tempered glass having a thickness of 3.2 mm is used as the light-receiving glass 1, the light-receiving surface side-sealing EVA layer (attachment film layer) 2 having a thickness of 0.6 mm, the photovoltaic cell matrix 3, the back surface side-sealing EVA layer 4 having a thickness of 0.4 mm and a back surface-sealing weatherproof film 5 (PET: polyethylene terephthalate based-film, a thickness of 100 μm) are laminated sequentially in this order on one surface (back surface) of the light-receiving glass 1. The laminated layers (photovoltaic module) having such an arrangement of the materials are integrated into one piece by a known sealing processing technique (e.g., an autoclave method, a vacuum laminate technique or the like), and then the EVA of the layers is reacted to be cross-linked with each other for integration into a module.

After the module integration processing as above is completed, a peripheral frame 6 for the module and a terminal box 7 for electrical connection are provided, so that a photovoltaic module is completed. In the photovoltaic module to which the present invention is applied, the thickness and the type of the light-receiving glass and the EVA layers are not limited to the above values. Moreover, any wiring methods can be used for the photovoltaic cell matrix.

In this embodiment, the thus produced photovoltaic module that has been used outdoors for a certain period (e.g., 10 years or more) is regenerated in the following manner. First, as shown in FIGS. 3A and 3B, the peripheral frame 6 and the terminal box 7 are removed, and then the back surface-sealing weatherproof film 5 is entirely peeled by a mechanical method (e.g., manual peeling). Thereafter, a new back surface side-sealing EVA layer 8 and a new back surface-sealing weatherproof film 9 are laminated sequentially in this order on the existing back surface side-sealing EVA layer 4 (FIG. 3C). Then, integrating processing (film attachment sealing processing) is performed by a known sealing processing technique (e.g., an autoclave method, a vacuum lamination technique or the like), and then a new terminal box 10 and a new peripheral frame 11 are provided. Thus, the photovoltaic module can be regenerated.

In the embodiment shown in FIGS. 3A to 3C, as the terminal box 10 and the peripheral frame 11, a new box and a new frame are used, respectively, but the present invention is not limited thereto, and the existing peripheral frame 6 and the existing terminal box 7 that have been removed from the module at the time of performing a regeneration treatment can be used again. Furthermore, the existing terminal box and a new peripheral frame or a new terminal box and the existing peripheral frame can be combined and provided again.

Figure 3:
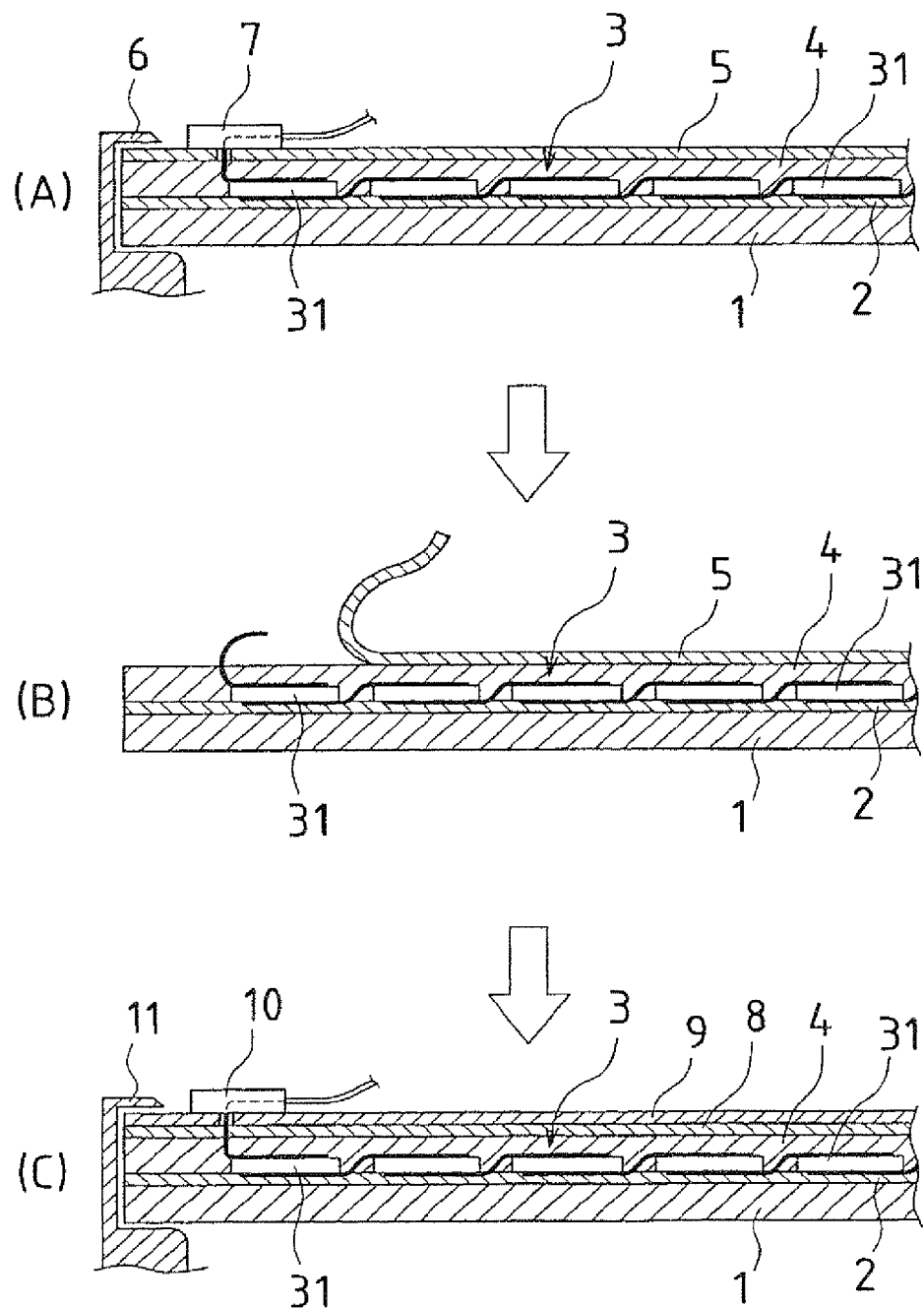
FIGS. 3A to 3C are views of an embodiment of a method for regenerating a photovoltaic module of the present invention.

When the regenerating method of FIG. 3 (replacement on the entire surface) is performed, it is preferable to use a film with a black color at least on the light-receiving surface side as the new back surface-sealing weatherproof film 9 used for the regeneration treatment. If the new sealing weatherproof film 9 is black at least on the light-receiving surface side, possibly occurrence of poor appearance such as a color change into yellow of the existing EVA that originally has sealed the photovoltaic module cannot become distinct in the entire appearance.

Then, another embodiment of the present invention will be described with reference to FIGS. 4A to 4C.

This embodiment shows a treatment example suitable for regeneration in the case where defects are present partially in the photovoltaic module shown in FIG. 1 (e.g., there is a space 12 between the back surface-sealing weatherproof film 5 and the back surface side-sealing EVA layer 4, as shown in FIG. 4A). A specific treatment will be described below.

First, a current is applied across the positive electrode and the negative electrode terminals of the photovoltaic module in the forward direction. With this application of current, a temperature difference (in-plane temperature distribution) generated in the back surface of the photovoltaic module is detected in the form of an image using an infrared thermoviewer (not shown).

In this case, when the space 12 is present between the back surface-sealing weatherproof film 5 and the back surface side-sealing EVA layer 4 (FIG. 4A) because of peeling or outgas or the like, as a result of the detection of the infrared thermoviewer, that is, since the temperature in a portion corresponding to the space 12 is low in the in-plane temperature portion of the back surface of the photovoltaic module, the defective portion of the photovoltaic module can be specified based on the in-plane temperature distribution. Then, as shown in FIGS. 4A to 4C, the defective portion (the portion corresponding to the space 12) specified by the above-described detection is cut out (peeled), and a new back surface side-sealing EVA layer 8 and a new back surface-sealing weatherproof film 9 are laminated partially on this cut-out portion, and resealing regeneration processing is performed partially. Thus, the photovoltaic module can be regenerated.

In the in-plane temperature distribution in the back surface of the photovoltaic module, if there is a portion that has an extremely lower temperature than that in other portions, that can be specified to be caused by cell breakage or resistance heat generation due to poor connection of interconnectors. Therefore, resealing regeneration processing can be partially performed to the defective portion in the same manner as shown in FIGS. 4A to 4C, so that the photovoltaic module can be regenerated.

Figure 4:
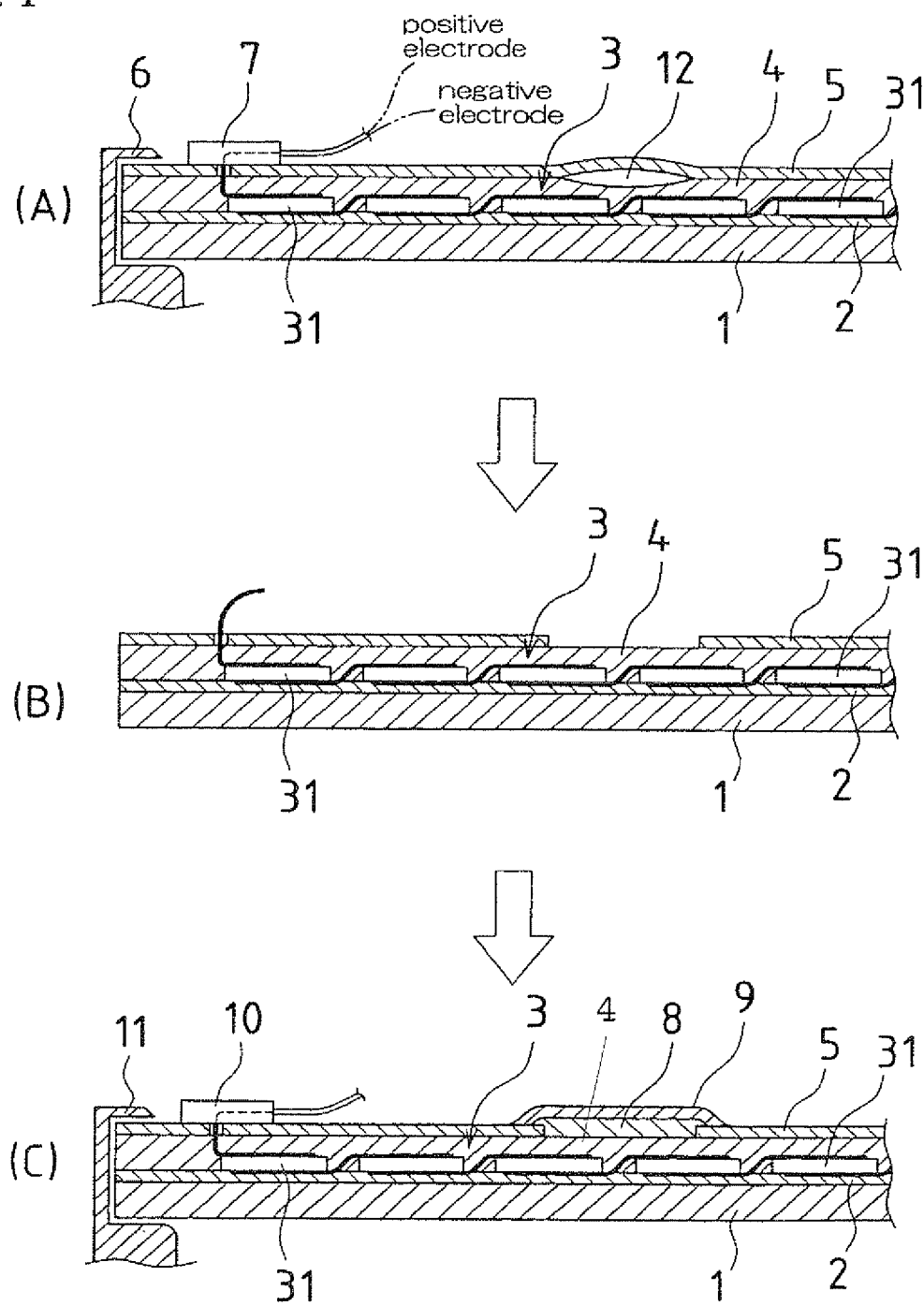
FIGS. 4A to 4C are views of an embodiment of another method for regenerating a photovoltaic module of the present invention.

In the embodiment of FIG. 4, a defective portion is detected and specified by applying current across the positive electrode and the negative electrode terminals of the photovoltaic module in the forward direction. However, instead of this, the following approach can be used. The light-receiving surface is irradiated with solar light or halogen or xenon lamp light while the positive electrode and the negative electrode terminals are short-circuited, and the temperature distribution in the back surface of the photovoltaic module is detected by an infrared thermoviewer so that a defective portion is specified.

Next, the peeling treatment (film peeling treatment) of the back surface-sealing weatherproof film 5 used in the embodiments of the present invention and the new back surface side-sealing EVA layer that is laminated after the film peeling will be described in detail.

In the regenerating method of FIGS. 3A to 3C and FIGS. 4A to 4C, when mechanically peeling the back surface-sealing weatherproof film 5, the photovoltaic module is subjected to curing by outdoor exposure, so that the back surface-sealing weatherproof film 5 can be peeled easily.

For example, in the case where the back surface-sealing weatherproof film 5 is formed of a material containing ester bonds, when mechanically peeling the back surface-sealing weatherproof film 5 from the photovoltaic module, peeling can be performed easily, even in a mechanical method, by placing the photovoltaic module in an environment of a temperature and humidity cycle or a combined cycle by outdoor exposure. In this case, hydrolysis occurs so that the ester bonds of the back surface-sealing weatherproof film 5 are broken, and film deterioration and breakage is caused by a reduction of the molecular weight. Further, even if the back surface-sealing weatherproof film 5 does not contain ester bonds, a reduction of the molecular weight or crystallization of polymers of the film promote the film fatigue. Therefore, even mechanical peeling can be performed easily.

Furthermore, the back surface-sealing weatherproof film 5 can be peeled easily by curing the photovoltaic module at a high temperature, high humidity and high pressure (e.g., placing it in a water vapor pressure boiler at 105° C., 100% RH and 1.2 atm for four hours).

For example, when the back surface-sealing weatherproof film 5 is formed of a material containing ester bonds, the back surface-sealing weatherproof film 5 can be peeled easily from the photovoltaic module by placing the photovoltaic module under high temperature, high humidity and high pressure. More specifically, a hydrolysis reaction that breaks the ester bonds is promoted by the function of the high temperature water vapor, so that the film is deteriorated and broken even more rapidly by a reduction of the molecular weight. Further, even if the back surface-sealing weatherproof film 5 does not contain ester bonds, a reduction of the molecular weight or crystallization of polymers of the film proceed rapidly and thus the film fatigue proceeds even more rapidly. Therefore, peeling can be performed easily.

In the embodiment of the present invention, it is preferable that EVA having a shorter time for crosslinking than that of EVA of each of the existing light-receiving surface side EVA layer 2 and the back surface side-sealing EVA layer 4 that originally have sealed the photovoltaic cell matrix 3 is used for the EVA constituting the new back surface side-sealing EVA layer 8.

By making the crosslinking time of the EVA (back surface side-sealing EVA) for the back surface side-sealing EVA layer 8 used for the regeneration treatment short, the existing EVA that originally has sealed the photovoltaic module can be prevented from being crosslinked excessively when attaching and curing for crosslinking the new back surface-sealing weatherproof film with the new back surface side-sealing EVA, so that poor appearance due to shrinkage of the EVA or generation of outgas and removal of serial wiring of the photovoltaic cell 31, etc. can be prevented.

In the embodiment of the present invention, it is preferable that EVA having a lower temperature for crosslinking than that of EVA of each of the existing light-receiving surface side EVA layer 2 and the back surface side-sealing EVA layer 4 that originally have sealed the photovoltaic cell matrix 3 is used for the EVA constituting the new back surface side-sealing EVA layer 8.

By making the temperature for crosslinking of the EVA (back surface side-sealing EVA) for the back surface side-sealing EVA layer 8 used for the regeneration treatment low, the existing EVA that originally has sealed the photovoltaic module can be prevented from being crosslinked excessively when attaching and curing for crosslinking the new back surface-sealing weatherproof film with the new back surface side-sealing EVA, so that poor appearance due to shrinkage of the EVA or generation of outgas and removal of serial wiring of the photovoltaic cell 31, etc. can be prevented.

In the embodiment of the present invention, it is preferable that EVA containing a larger amount of an anti-ultraviolet agent (ultraviolet stabilizer) than that of EVA of each of the existing light-receiving surface side EVA layer 2 and the back surface side-sealing EVA layer 4 that originally have sealed the photovoltaic cell matrix 3 is used for the EVA constituting the new back surface side-sealing EVA layer 8.

By containing a large amount of an anti-ultraviolet agent in the EVA (back surface side-sealing EVA) for the back surface side-sealing EVA layer 8 used for the regeneration treatment, the anti-ultraviolet agent can be diffused by integrating the new back surface side-sealing EVA and the existing EVA. Therefore, in the photovoltaic module that has been used in the market for a long time, even if the anti-ultraviolet agent of the existing back surface side-sealing EVA layer 4 that originally has sealed the photovoltaic module has been consumed and disappeared, the anti-ultraviolet agent can be replenished from the back surface side-sealing EVA layer 8 to the existing back surface side-sealing EVA layer 4, which two layers constitute a two-layered structure by the regeneration treatment.

Examples of the anti-ultraviolet agent to be added to EVA include benzophenone-based, benzotriazole-based, benzoate-based, oxanide-based, HALS (Hindered Amine Light Stabilizer)-based agents and the like, depending on the preparation of EVA.

The present invention can be carried out in other various forms without departing the spirit or the principal characteristics of the present invention. Therefore, the above-described examples are only illustrative and should not be construed in the limited manner. The scope of the present invention is indicated by the appended claims and is not limited by the foregoing description. Furthermore, all changes which come within the meaning and range of equivalency of the claims are intended to be embraced therein.

Moreover, the application of the present invention is based on Japanese Patent Application No. 2002-161646 that was filled in Japan, which is incorporated herein by reference. The references cited herein are entirely incorporated specifically by reference.

We claim:

1. A photovoltaic module in which a light-receiving surface side-sealing resin layer, a photovoltaic cell, a back surface side-sealing resin layer and a back surface-sealing weatherproof film are laminated sequentially to each other in this order on a light-receiving glass and these components are formed into an integral piece, wherein a part or an entire of the back surface side-sealing resin layer consists of a two-layered structure in which a sealing resin layer on a photovoltaic cell side and a sealing resin layer on a back surface-sealing weather proof film side are integrated, wherein the sealing resin layer on the back surface-sealing weather proof film side contains an amount of anti-ultraviolet agent that is greater an amount of anti-ultraviolet agent contained in the sealing resin layer on the photovoltaic cell side.

2. The module according to claim 1, wherein the back surface-sealing weatherproof film is black at least on the light-receiving surface side.

\* \* \* \* \*